US008817573B2

(12) United States Patent
Ku

(10) Patent No.: US 8,817,573 B2
(45) Date of Patent: Aug. 26, 2014

(54) SEMICONDUCTOR MEMORY DEVICE INCLUDING MODE REGISTER SET AND METHOD FOR OPERATING THE SAME

(75) Inventor: Kie-Bong Ku, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 426 days.

(21) Appl. No.: 13/325,141

(22) Filed: Dec. 14, 2011

(65) Prior Publication Data

US 2012/0163098 A1    Jun. 28, 2012

(30) Foreign Application Priority Data

Dec. 28, 2010    (KR) .................. 10-2010-0136881

(51) Int. Cl.
*G11C 8/00*    (2006.01)
*G11C 7/10*    (2006.01)

(52) U.S. Cl.
USPC ................. 365/233.14; 365/189.05

(58) Field of Classification Search
CPC ................ G11C 7/1045; G11C 7/1063
USPC ........................ 365/189.05, 233.14
See application file for complete search history.

(56) References Cited

U.S. PATENT DOCUMENTS

| 5,973,988 | A  | * | 10/1999 | Nakahira et al. | ........... 365/49.17 |
|---|---|---|---|---|---|
| 7,821,846 | B2 | * | 10/2010 | Yoon | ........... 365/189.05 |
| 8,059,483 | B2 | * | 11/2011 | Kim et al. | ........... 365/230.06 |
| 2005/0007835 | A1 | * | 1/2005 | Lee et al. | ........... 365/189.12 |
| 2010/0302873 | A1 | * | 12/2010 | Lee | ........... 365/189.05 |
| 2012/0163099 | A1 | * | 6/2012 | Lee | ........... 365/189.05 |

* cited by examiner

*Primary Examiner* — Vanthu Nguyen
*Assistant Examiner* — Khamdan Alrobaie
(74) *Attorney, Agent, or Firm* — IP & T Group LLP

(57) ABSTRACT

A semiconductor memory device and method for operating the same includes a controller configured to generate a data buffer control signal in a mode register set (MRS) mode, a data buffer configured to buffer and output a plurality of MRS codes inputted through a data pad in response to the data buffer control signal, and a plurality of MRS command generators configured to receive the MRS codes outputted from the data buffer through a data line and generate a plurality of MRS commands based on the received MRS codes.

24 Claims, 7 Drawing Sheets

SEMICONDUCTOR MEMORY DEVICE INCLUDING MODE REGISTER SET AND METHOD FOR OPERATING THE SAME

CROSS-REFERENCE TO RELATED APPLICATIONS

The present application claims priority of Korean Patent Application No. 10-2010-0136881, filed on Dec. 28, 2010, which is incorporated herein by reference in its entirety.

BACKGROUND

1. Field of the Invention

Exemplary embodiments of the present invention relate to a semiconductor memory device and method for operating the same, and more particularly, to a semiconductor memory device including a mode register set.

2. Description of the Related Art

A register set (RS) is generally used for an operation of setting a particular mode among the operations of a Dynamic Random Access Memory (DRAM) device. Examples of an RS include a mode register set (MRS) and an extended mode register set (EMRS).

The MRS and EMRS set the DRAM device at a particular operation mode based on an MRS code applied through an address pin along with a mode register set command, and the established mode is maintained until a power source is no longer applied to the semiconductor memory device.

FIG. 1 is a block view illustrating an MRS command generation circuit of a known semiconductor memory device.

Referring to FIG. 1, the MRS command generation circuit includes an MRS mode signal generator 110, an address buffer 120, an MRS selection signal generator 130, and a plurality of MRS command generators 150A to 150E.

The MRS mode signal generator 110 may generate an MRS mode signal MRSP by decoding external command signals /CS, /RAS, /CAS and /WE. In particular, the MRS mode signal generator 110 may generate an MRS mode signal MRSP having the same pulse width as the pulse width of a clock signal CLK. The MRS mode signal MRSP may be enabled in an MRS mode where all the external command signals /CS, /RAS, /CAS and /WE are in a logic low level.

The address buffer 120 may output MRS source signals MREGI<0:12> for generating a plurality of MRS commands NMRS_CMD<0:12>, EMRS_CMD<0:12>, EMRS2_CMD<0:12>, EMRS3_CMD<0:12> and TMRS_CMD<0:12> based on first MRS codes A<0:12> applied through address pins A0 to A12 included therein in response to the enabled MRS mode signal MRSP.

The MRS selection signal generator 130 may generate a plurality of MRS selection signals NMRSP, EMRSP, EMRSP2, EMRSP3 and TMRSP for selecting an MRS mode to be set based on second MRS codes BA<0:2> applied through bank address pins B0 to B2 in response to the enabled MRS mode signal MRSP.

The MRS selection signal generator 130, as shown in the following Table 1, generates a plurality of MRS selection signals NMRSP, EMRS, EMRS2, and EMRS3 for setting an extended mode register by logically combining and decoding the logic values of the second MRS codes BA<0:2> that are applied to the bank address pins B0 to B2, and generates a TMRS selection signal TMRS for a test mode setting command based on the logic value of an MRS code A<7> which is applied to the seventh address pin A7.

TABLE 1

|       | NMRS | EMRS        | EMRS2       | EMRS3       | TMRS |
|-------|------|-------------|-------------|-------------|------|
| A<7>  | 0    | Do not care | Do not care | Do not care | 1    |
| BA<0> | 0    | 1           | 0           | 1           | 0    |
| BA<1> | 0    | 0           | 1           | 1           | 0    |
| BA<2> | 0    | 0           | 0           | 0           | 0    |

The MRS command generators 150A to 150E may generate the MRS commands NMRS_CMD<0:12>, EMRS_CMD<0:12>, EMRS2_CMD<0:12>, EMRS3_CMD<0:12> and TMRS_CMD<0:12> for setting the MRS mode of the semiconductor memory device by logically combining and decoding the MRS source signals MREGI<0:12> and the MRS selection signals NMRSP, EMRSP, EMRSP2, EMRSP3 and TMRSP.

To this end, the MRS command generators 150A to 150E may include an NMRS command generator 150A, an EMRS command generator 150B, an EMRS2 command generator 150C, an EMRS3 command generator 150D, and a TMRS command generator 150E.

The NMRS commands NMRS_CMD<0:12> include commands for setting NMRS based on the Joint Electron Device Engineering Council (JEDEC) specification of 512 MB Double Data Rate 2 Synchronous Dynamic Random Access Memory (DDR2 SDRAM) presented in FIG. 2.

FIG. 2 shows commands based on the JEDEC specification of a 512 MB DDR2 SDRAM device.

The NMRS commands NMRS_CMD for setting the NMRS include codes for setting a burst length, a burst type, an operation mode, and a CAS latency. Also, address pins are assigned for the setup of the codes.

For example, address pins A0 to A2 are assigned for setting up the burst length, and an address pin A3 is assigned for setting up the burst type BT. Address pins A4 to A6 are assigned for setting up the CAS latency, and address pins A7 to A12 are assigned for receiving an MRS code, including a test mode code TM, a DLL reset code DLL, a write recovery code WR, and a power down code PD, for setting up the operation mode.

Meanwhile, since MRS is set up through the address pins, the modes that are not included in the address pins A0 to A12 are set through an EMRS. The EMRS commands EMRS_CMD may include several commands for setting EMRS, and the EMRS2 commands EMRS2_CMD and the EMRS3 commands EMRS3_CMD may include several commands for setting the EMRS2 and the EMRS3, respectively.

However, because the NMRS command generator 150A, the EMRS command generator 150B, the EMRS2 command generator 150C, the EMRS3 command generator 150D, and the TMRS command generator 150E, in accordance with the known technology, have to receive MRS codes through the address pins A0 to A12 that are already provided, the MRS command generators 150A to 150E are formed in a peripheral circuit region. For this reason, the density of the peripheral circuit region becomes high and the size of the peripheral circuit region becomes great, creating a disadvantage in terms of design efficiency.

The MRS commands NMRS_CMD<0:12>, EMRS_CMD<0:12>, EMRS2_CMD<0:12>, EMRS3_CMD<0:12> and TMRS_CMD<0:12>, which are generated in the MRS command generators 150A to 150E disposed in the peripheral circuit region, have to be transferred from the peripheral circuit region to the constituent elements where the MRS commands are used inside of a semiconductor memory block. Therefore, data lines extending from the peripheral circuit region to the constituent elements where the MRS commands are used inside of a semiconductor memory block are required to transfer the MRS commands NMR-S_CMD<0:12>, EMRS_CMD<0:12>, EMRS2_CMD<0:12>, EMRS3_CMD<0:12> and TMRS_CMD<0:12>.

Recently, as the number of modes set in a semiconductor memory device increases, the number of MRS codes increases as well. Since it is expected that more address pins need to be assigned to receive more MRS codes, the size of the semiconductor memory device is expected to increase, which leads to a decrease in cell capacity.

Also, according to the known technology, whenever the first MRS codes A<0:12> and the second MRS codes BA<0:2> are sequentially inputted through the address pins, they should be decoded, which is vexatious. The decoding process not only deteriorates the driving rate of the semiconductor memory device, but also increases the amount of power consumption. The more times the decoding process is performed, the more power is consumed.

SUMMARY

Exemplary embodiments of the present invention are directed to a semiconductor memory device whose peripheral circuit region is reduced by including a mode register set.

Other exemplary embodiments of the present invention are directed to a semiconductor memory device which transfers MRS commands to the constituent elements where the MRS commands are used inside of semiconductor memory blocks without using data lines that are solely used for the transfer of the MRS commands.

Other exemplary embodiments of the present invention are directed to a semiconductor memory device including a mode register set which receives a plurality of MRS commands without using an additional address pin.

Other exemplary embodiments of the present invention are directed to a semiconductor memory device including a mode register set which may decrease the time taken for generating an MRS command.

Other exemplary embodiments of the present invention are directed to a semiconductor memory device including a mode register set which may have an increased driving rate and reduce the amount of current consumption.

In accordance with an exemplary embodiment of the present invention, a semiconductor memory device includes a controller configured to generate a data buffer control signal in a mode register set (MRS) mode, a data buffer configured to buffer and output a plurality of MRS codes inputted through a data pad in response to the data buffer control signal, and a plurality of MRS command generators configured to receive the MRS codes outputted from the data buffer through a data line and generate a plurality of MRS commands based on the received MRS codes.

In accordance with another exemplary embodiment of the present invention, a method for operating a semiconductor memory device includes generating a data buffer control signal in a mode register set (MRS) mode, buffering and outputting a plurality of MRS codes inputted through a data pad in response to the data buffer control signal, and receiving the MRS codes through a data line and generating a plurality of MRS commands based on the received MRS codes.

DETAILED DESCRIPTION

Figure 1:
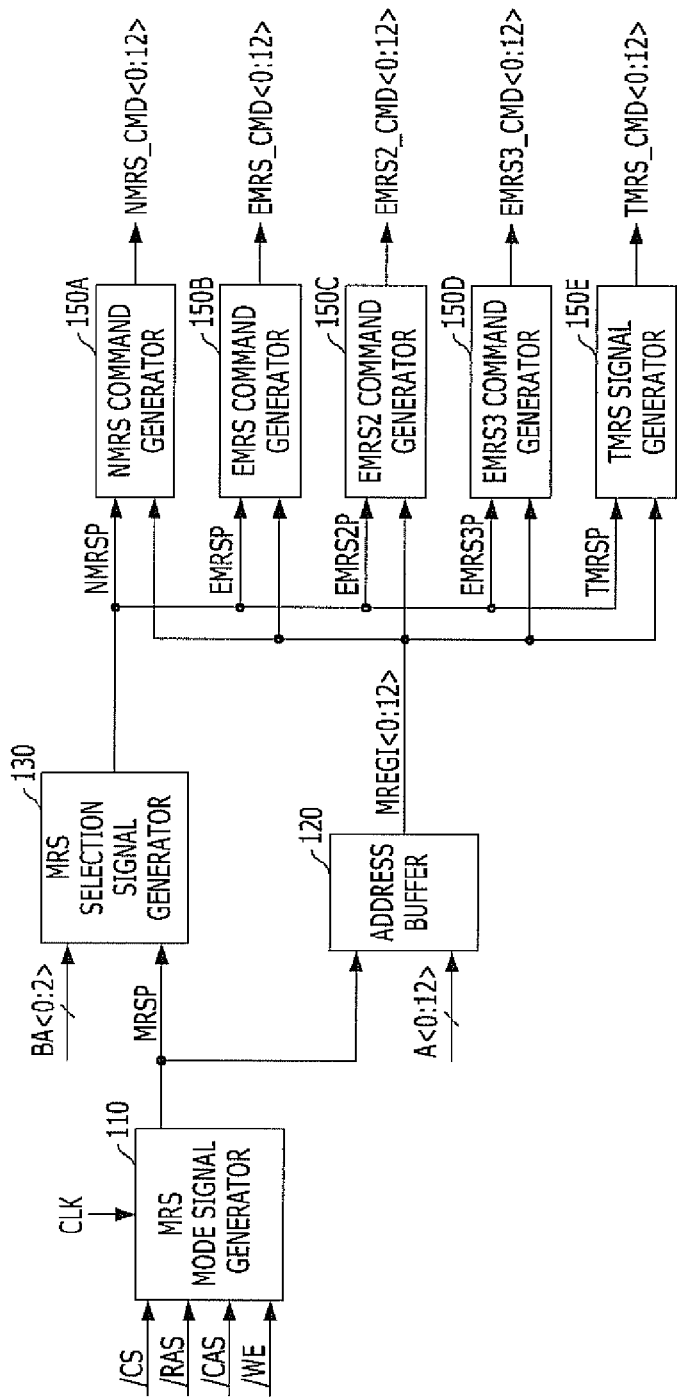
FIG. 1 is a block diagram illustrating a mode register set (MRS) command generation circuit of a known semiconductor memory device.
Figure 2:
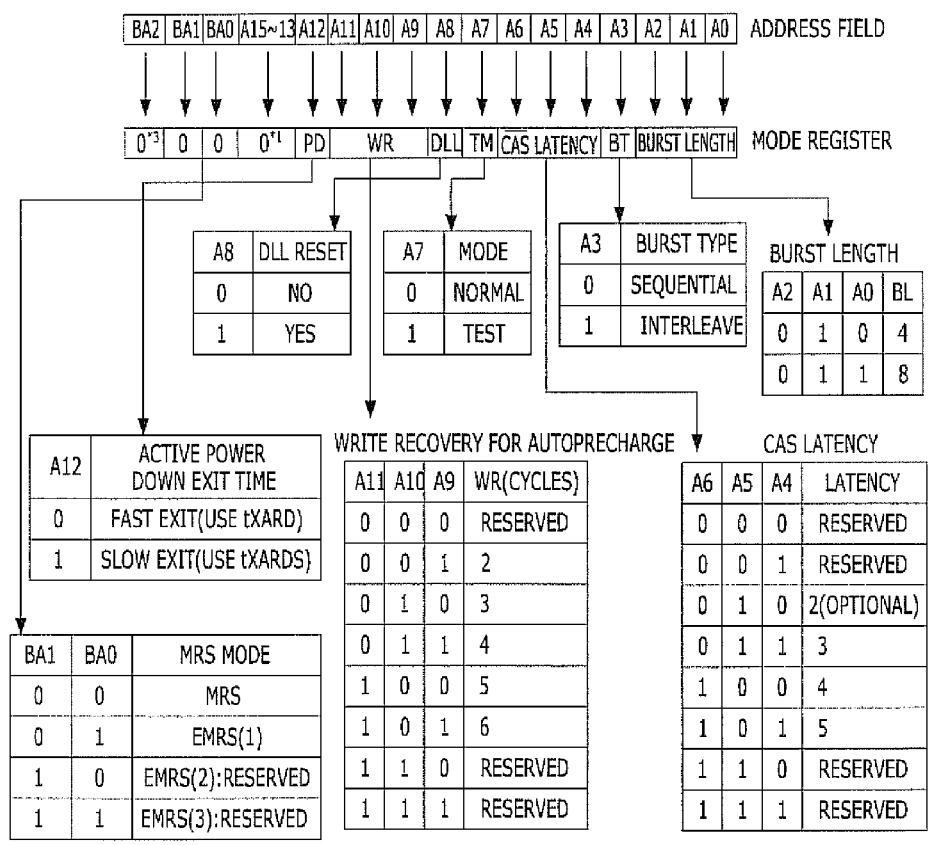
FIG. 2 shows commands based on the Joint Electron Device Engineering Council (JEDEC) specification of a 512 MB Double Data Rate 2 Synchronous Dynamic Random Access Memory (DDR2 SDRAM) device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
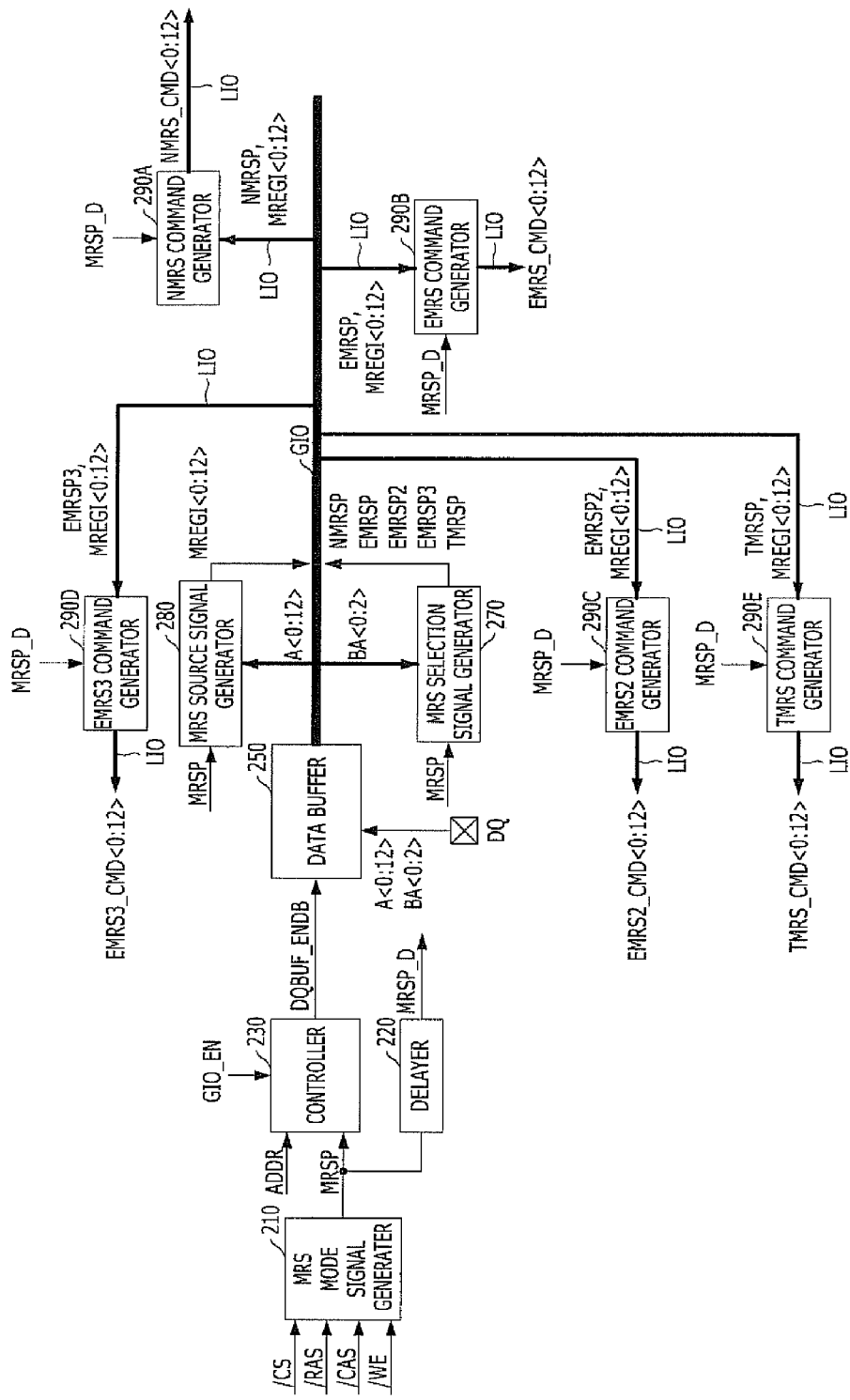
FIG. 3 is a block diagram of an MRS command generation circuit in accordance with an exemplary embodiment of the present invention.
Figure 4:
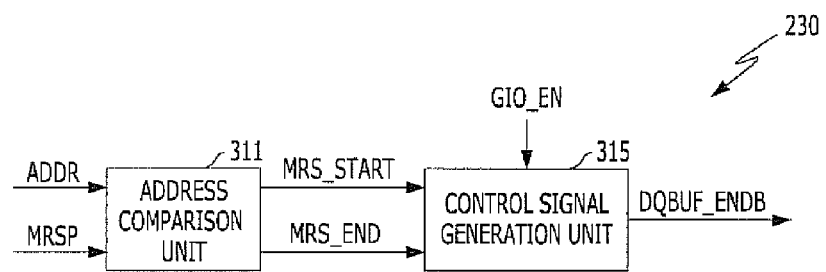
FIG. 4 is a block diagram of a controller shown in FIG. 3.

FIG. 3 is a block diagram of a mode register set (MRS) command generation circuit in accordance with an exemplary embodiment of the present invention, and FIG. 4 is a block diagram of a controller 230 shown in FIG. 3.

Referring to FIG. 3, the MRS command generation circuit includes an MRS mode signal generator 210, a delayer 220, a controller 230, a data buffer 250, an MRS selection signal generator 270, an MRS source signal generator 280, and a plurality of the MRS command generators 290A to 290E.

The MRS mode signal generator 210 generates an MRS mode signal MRSP by decoding external command signals /CS, /RAS, /CAS and /WE in response to a clock signal CLK. In particular, the MRS mode signal generator 210 may generate an MRS mode signal MRSP having the same pulse width as the pulse width of the clock signal CLK. The MRS mode signal MRSP may be enabled in an MRS mode where all the external command signals /CS, /RAS, /CAS and /WE are disabled to a logic low level.

The delayer 220 outputs a delayed MRS mode signal MRSP_D which is a signal obtained by delaying the MRS mode signal MRSP, generated in the MRS mode signal generator 210, by a certain delay amount. The delayed MRS mode signal MRSP_D is inputted to the MRS command generators 290A to 290E. The certain delay amount is equivalent to an amount required to compensate for a transfer delay of the MRS mode signal MRSP from the time it is generated in the MRS mode signal generator 210 until the MRS mode signal MRSP is transferred to the MRS command generators 290A to 290E. That is, the certain delay amount compensates for the time needed to transfer the MRS mode signal MSRP through a global input/output line GIO and a local input/output line LIO.

The controller 230 receives an address ADDR, which is transferred from the outside through an existing address pin, and the MRS mode signal MRSP, which is transferred from the MRS mode signal generator 210, and generates a data buffer control signal DQBUF_ENDB.

The data buffer control signal DQBUF_ENDB is a signal for controlling the data buffer 250 to receive or not receive first MRS codes A<0:12> and second MRS codes BA<0:2> through a data pad DQ.

Referring to FIG. 4, the data buffer 250 buffers and parallelizes the first MRS codes A<0:12> and the second MRS codes BA<0:2> that are received in series through the data pad DQ in response to the data buffer control signal DQBUF_ENDB enabled to a logic low level. Since the first MRS codes A<0:12> are received through the data pad DQ, the number of address pins does not have to be increased even though the number of MRS codes is increased. As a result, the area efficiency of the semiconductor memory device is increased. Also, since a plurality of MRS codes may be received through the data pad DQ, diverse kinds of MRS commands may be generated and the time for generating the MRS commands may be reduced by decreasing the reception time and decoding time of the MRS codes.

The data buffer 250 receives the first MRS codes A<0:12> and the second MRS codes BA<0:2> when the data buffer control signal DQBUF_ENDB is enabled, and stops receiving the first MRS codes A<0:12> and the second MRS codes BA<0:2> when the data buffer control signal DQBUF_ENDB is disabled.

As described above, the data buffer 250 included in the MRS command generation circuit may reduce the amount of current that is unnecessarily consumed while the first MRS codes A<0:12> and the second MRS codes BA<0:2> are not received, because the first MRS codes A<0:12> and the second MRS codes BA<0:2> for generating the MRS commands NMRS_CMD<0:12>, EMRS_CMD<0:12>, EMRS2_CMD<0:12>, EMRS3_CMD<0:12> and TMRS_CMD<0:12> are enabled only when they are inputted through the data pad DQ.

The data buffer 250 performs a serial-to-parallel operation to parallelize the first MRS codes A<0:12> and the second MRS codes BA<0:2> that are received in series, and loads the parallel codes on global input/output lines GIO.

The MRS selection signal generator 270 receives the second MRS codes BA<0:2> outputted from the data buffer 250 through the global input/output lines GIO, generates a plurality of MRS selection signals NMRSP, EMRSP, EMRSP2, EMRSP3 and TMRSP for selecting an MRS mode to be set, and outputs the generated MRS selection signals NMRSP, EMRSP, EMRSP2, EMRSP3 and TMRSP through the global input/output lines GIO in response to the enabled MRS mode signal MRSP.

The MRS source signal generator 280 receives the first MRS codes A<0:12> through the global input/output lines GIO, generates MRS source signals MREGI<0:12>, and outputs the generated MRS source signals MREGI<0:12> through the data lines of the global input/output lines GIO in response to the enabled MRS mode signal MRSP.

The MRS command generators 290A to 290E drive, logically combine, and decode the MRS source signals MREGI<0:12> and a corresponding signal among the MRS selection signals NMRSP, EMRSP, EMRSP2, EMRSP3 and TMRSP, which are received through the global input/output lines GIO and the local input/output lines LIO, in response to the delayed MRS mode signal MRSP_D. Further, the MRS command generators 290A to 290E generate the MRS commands NMRS_CMD<0:12>, EMRS_CMD<0:12>, EMRS2_CMD<0:12>, EMRS3_CMD<0:12> and TMRS_CMD<0:12> for setting the semiconductor memory device at a particular mode, and transfer the generated MRS commands NMRS_CMD<0:12>, EMRS_CMD<0:12>, EMRS2_CMD<0:12>, EMRS3_CMD<0:12> and TMRS_CMD<0:12> to the constituent elements where the MRS commands are used inside of a semiconductor memory block.

To this end, the MRS command generators 290A to 290E include an NMRS command generator 290A, an EMRS command generator 290B, an EMRS2 command generator 290C, an EMRS3 command generator 290D, and a TMRS command generator 290E.

The MRS command generators 290A to 290E do not have to be positioned densely in a particular location of a peripheral circuit region. Rather, the MRS command generators 290A to 290E may be positioned in the memory blocks where the respective MRS commands are used. Therefore, the size of the peripheral circuit region may be decreased. Also, since the MRS command generators 290A to 290E receive multiple MRS codes through the data pad DQ, the MRS command generators 290A to 290E may generate many kinds of MRS commands based on the received MRS codes.

Herein, since the MRS command generators 290A to 290E receive the MRS selection signals NMRSP, EMRSP, EMRSP2, EMRSP3 and TMRSP through the global input/output lines GIO and the local input/output lines LIO that are already provided to the semiconductor memory device, and transfer the generated MRS commands NMRS_CMD<0:12>, EMRS_CMD<0:12>, EMRS2_CMD<0:12>, EMRS3_CMD<0:12> and TMRS_CMD<0:12> to the respective memory blocks through local input/output lines LIO that are already provided to the semiconductor memory device, it is possible to generate the MRS commands and transfer them to the respective memory blocks without forming an additional line.

FIG. 4 is a block diagram of a controller 230 shown in FIG. 3.

Referring to FIG. 4, the controller 230 includes an address comparison unit 311 and a control signal generation unit 315.

The address comparison unit 311 compares the address ADDR received from the outside through the address pin, which is already provided to the semiconductor memory device, with a first address ADDR1 (not shown), which may be stored inside the address comparison unit 311, in response to the enabled MRS mode signal MRSP. As a result of the comparison, if the address ADDR and the first address ADDR1 are the same, the address comparison unit 311 outputs a first signal MRS_START.

Also, the address comparison unit 311 compares the address ADDR received from the outside through the address pin, which is already provided to the semiconductor memory device, with a second address ADDR2 (not shown), which may also be stored inside the address comparison unit 311, in response to the enabled MRS mode signal MRSP. As a result of the comparison, if the address ADDR and the second address ADDR2 are the same, the address comparison unit 311 outputs a second signal MRS_END.

The control signal generation unit 315 logically combines the first signal MRS_START and the second signal MRS_END that are outputted from the address comparison unit 311, and generates a data buffer control signal DQBUF_ENDB in response to a data line driving signal GIO_EN. The data buffer control signal DQBUF_ENDB is a signal for controlling the data buffer 250 to receive the first MRS codes A<0:12> and the second MRS codes BA<0:2> through the data pad DQ.

The data line driving signal GIO_EN is a signal for enabling a data line to transfer the MRS selection signals NMRSP, EMRSP, EMRSP2, EMRSP3 and TMRSP and the MRS source signals MREGI<0:12> through the data line. In one exemplary embodiment of the present invention, an enabling signal WE may be used as the global line driving signal GIO_EN. In another exemplary embodiment of the present invention, an early write latency (EWL) signal may be used to drive the global input/output lines GIO. Although these two cases are provided, the scope and spirit of the present invention are not limited to such cases.

Figure 5:
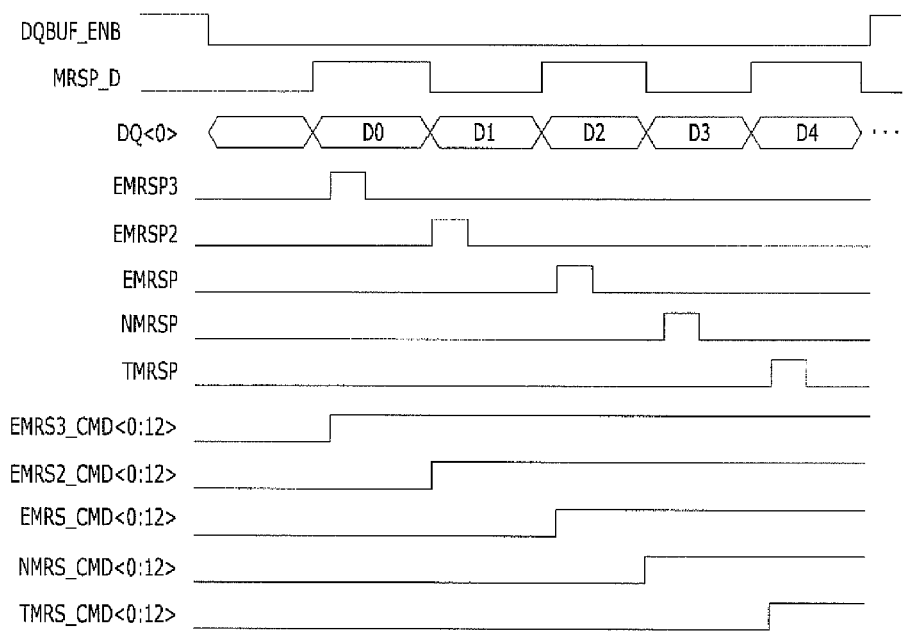
FIG. 5 is an input/output signal timing diagram of the MRS command generation circuit shown in FIG. 3 in accordance with a first exemplary embodiment of the present invention.
Figure 6:
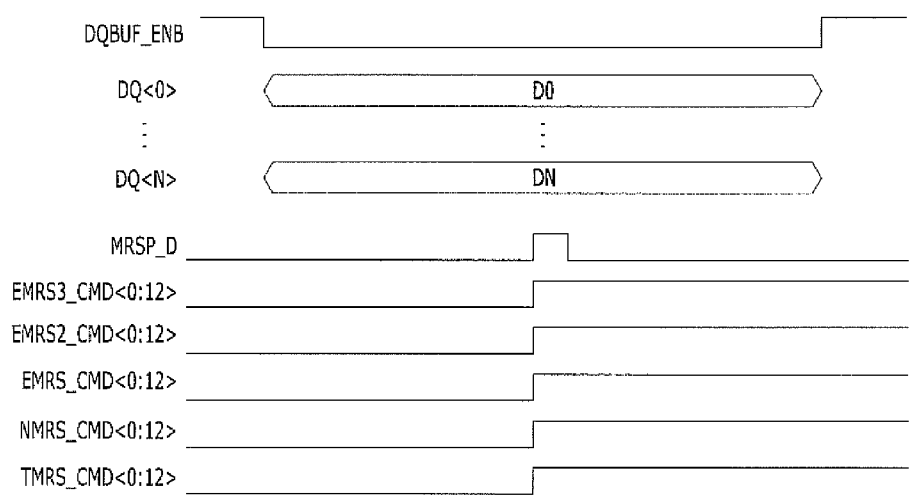
FIG. 6 is an input/output signal timing diagram of the MRS command generation circuit shown in FIG. 3 in accordance with a second exemplary embodiment of the present invention.

FIG. 5 is an input/output signal timing diagram of the MRS command generation circuit shown in FIG. 3 in accordance with a first exemplary embodiment of the present invention, and FIG. 6 is an input/output signal timing diagram of the MRS command generation circuit shown in FIG. 3 in accordance with a second exemplary embodiment of the present invention.

FIG. 5 shows that the first MRS codes A<0:12> and the second MRS codes BA<0:2> are inputted through one data pad DQ<0>, and shows when the MRS selection signals NMRSP, EMRSP, EMRSP2, EMRSP3, and TMRSP are activated for generating the MRS commands NMRS_CMD<0:12>, EMRS_CMD<0:12>, EMRS2_CMD<0:12>, EMRS3_CMD<0:12> and TMRS_CMD<0:12>.

The delayer 220 receives the MRS mode signal MRSP enabled in the MRS mode, delays the received MRS mode signal MRSP by the delay amount according to the length of the data line, and outputs the delayed MRS mode signal MRSP as a delayed MRS mode signal MRSP_D.

The controller 230 combines the MRS mode signal MRSP enabled in the MRS mode with the address ADDR received through the address pin, and generates the data buffer control signal DQBUF_ENDB.

First, when the data buffer control signal DQBUF_ENDB is enabled to a logic low level, the data buffer 250 is enabled and sequentially receives the first MRS codes A<0:12> and the second MRS codes BA<0:2> through the data pad DQ<0>. The data buffer 250 sequentially receives the first MRS codes A<0:12> and the second MRS codes BA<0:2>, converts them into parallel data (e.g., into data D0 to D4, as shown in FIG. 5), buffers the parallel data, and loads the buffered data onto the global input/output lines GIO.

The MRS selection signal generator 270 generates the MRS selection signals NMRSP, EMRSP, EMRSP2, EMRSP3 and TMRSP and loads them onto the global input/output lines GIO by using the second MRS codes BA<0:2> which are converted into parallel signals by the data buffer 250 in response to a toggling MRS mode signal MRSP.

The MRS source signal generator 280 generates the MRS source signals MREGI<0:12> and loads them onto the local input/output lines LIO by using the first MRS codes A<0:12> which are converted into parallel data by the data buffer 250.

The MRS command generators 290A to 290E generate the MRS commands NMRS_CMD<0:12>, EMRS_CMD<0:12>, EMRS2_CMD<0:12>, EMRS3_CMD<0:12> and TMRS_CMD<0:12> and load them onto the local input/output lines LIO by decoding the MRS source signals MREGI<0:12> in response to the delayed MRS mode signal MRSP_D. The MRS commands NMRS_CMD<0:12>, EMRS_CMD<0:12>, EMRS2_CMD<0:12>, EMRS3_CMD<0:12> and TMRS_CMD<0:12> includes a plurality of codes including MRS code, including a test mode code TM, a DLL reset code DLL, a write recovery code WR, and a power down code PD, for setting up the operation mode.

Referring to FIG. 5, when one data pad DQ<0> is driven, less current is consumed than when a plurality of data pads DQ<0:N> are driven.

FIG. 6 shows that the first MRS codes A<0:12> and the second MRS codes BA<0:2> are inputted through a plurality of data pads DQ<0:N>, and shows timings when the MRS commands NMRS_CMD<0:12>, EMRS_CMD<0:12>, EMRS2_CMD<0:12>, EMRS3_CMD<0:12> and TMRS_CMD<0:12> are generated.

Referring to FIG. 6, when the data buffer control signal DQBUF_ENDB is enabled to a logic low level in the MRS mode, the first MRS codes A<0:12> and the second MRS codes BA<0:2> begin to be inputted through the data pads DQ<0:N>.

The data buffer 250 sequentially buffers the first MRS codes A<0:12> and the second MRS codes BA<0:2> in response to the enabled data buffer control signal DQBUF_ENDB.

The data buffer 250 buffers the first MRS codes A<0:12> and the second MRS codes BA<0:2> that are inputted through the multiple data pads DQ<0:N>, and converts the buffered signals into parallel signals (e.g., into data D0 to D4, as shown in FIG. 6) based on the data buffer control signal DQBUF_ENDB enabled to a logic low level.

The MRS selection signal generator 270 generates the MRS selection signals NMRSP, EMRSP, EMRSP2, EMRSP3 and TMRSP, and loads the generated MRS selection signals onto the global input/output lines GIO in response to the second MRS codes BA<0:2> which are converted into parallel signals by the data buffer 250.

The MRS command generators 290A to 290E generate the MRS commands NMRS_CMD<0:12>, EMRS_CMD<0:12>, EMRS2_CMD<0:12>, EMRS3_CMD<0:12> and TMRS_CMD<0:12> by decoding the MRS source signals MREGI<0:12>, and load the generated MRS commands onto the local input/output lines LIO.

Generally, a semiconductor memory device synchronizes a data to the rising edge and falling edge of a clock and outputs the synchronized data to a memory controller. Herein, the data may be transferred when the rising edge and falling edge of an internal clock are within a valid window of the data outputted from the semiconductor memory device.

However, as the size of the valid data window becomes smaller and smaller in a high-speed operation system and the volume of data exchanged between a semiconductor memory device and a memory controller increases, it becomes more difficult to receive the data. Thus, data training is needed to secure the high-speed operation of the semiconductor memory device and a data processing device.

In an exemplary embodiment of the present invention, since the first MRS codes A<0:12> and the second MRS codes BA<0:2> are inputted through multiple data pads DQ<0:N>, wider setup/hold window margins of data are secured in the semiconductor memory device without a data training process.

Referring to FIG. 6, since the MRS selection signals NMRSP, EMRSP, EMRSP2, EMRSP3 and TMRSP are inputted all at once to the multiple data pads DQ<0:N>, there is an advantage that the time for generating the MRS commands NMRS_CMD<0:12>, EMRS_CMD<0:12>, EMRS2_CMD<0:12>, EMRS3_CMD<0:12> and TMRS_CMD<0:12> may be reduced in comparison to the exemplary embodiment shown in FIG. 5.

Moreover, the size of a peripheral circuit region may be reduced as well by disposing the MRS command generators 290A to 290E for generating the MRS commands NMRS_CMD<0:12>, EMRS_CMD<0:12>, EMRS2_CMD<0:12>, EMRS3_CMD<0:12> and TMRS_CMD<0:12> in the constituent elements where the corresponding MRS commands NMRS_CMD<0:12>, EMRS_CMD<0:12>, EMRS2_CMD<0:12>, EMRS3_CMD<0:12> and TMRS_CMD<0:12> are used inside of the semiconductor memory block.

In the exemplary embodiments of the present invention described in FIGS. 3 to 6, many MRS codes are received through a data pad instead of address pins. Therefore, diverse MRS commands may be generated simultaneously. Also, the time taken for generating the MRS commands NMRS_CMD<0:12>, EMRS_CMD<0:12>, EMRS2_CMD<0:12>, EMRS3_CMD<0:12> and TMRS_CMD<0:12> may be reduced by receiving many MRS codes through a data pad and decoding the received MRS codes all at one time. Also, since the MRS commands NMRS_CMD<0:12>, EMRS_CMD<0:12>, EMRS2_CMD<0:12>, EMRS3_CMD<0:12> and TMRS_CMD<0:12> are transferred to the constituent elements where the MRS commands are used inside of a semiconductor memory device through existing lines, e.g., global input/output lines GIO and local input/output lines LIO, the MRS commands NMRS_CMD<0:12>, EMRS_CMD<0:12>, EMRS2_CMD<0:12>, EMRS3_CMD<0:12> and TMRS_CMD<0:12> may be transferred without forming additional lines dedicated for the transfer of the MRS commands. Also, unnecessary waiting current may be reduced by driving the data buffer only when an MRS code for generating an MRS command is inputted.

Figure 7:
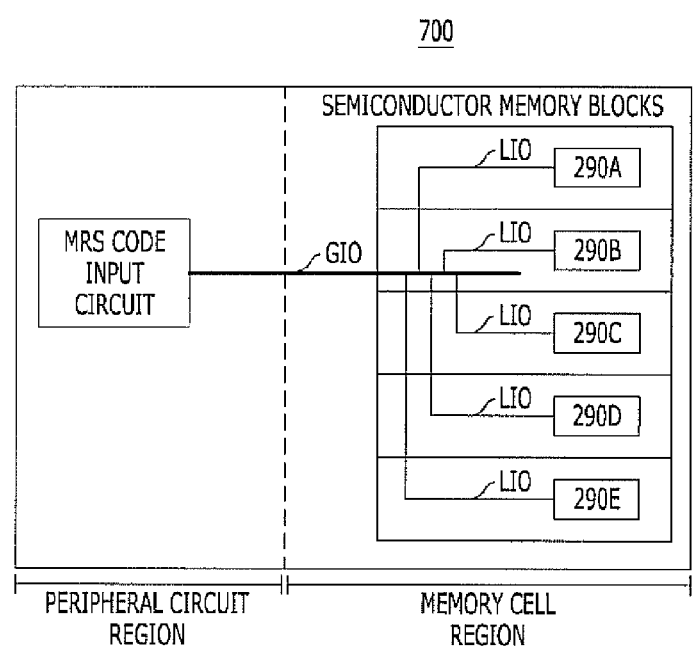
FIG. 7 is a block diagram of a semiconductor memory device in accordance with an exemplary embodiment of the present invention.

FIG. 7 is a block diagram of a semiconductor memory device 700 in accordance with an exemplary embodiment of the present invention. As shown in FIG. 7, the semiconductor memory device 700 includes a peripheral circuit region and a memory cell region. An MRS code input circuit 701 may be formed in the peripheral circuit region. The MRS code input circuit 701 may include the MRS mode signal generator 210, the delayer 220, the controller 230, the data buffer 250, the MRS selection signal generator 270, and the MRS source signal generator 280 of FIG. 3. The MRS code input circuit 701 outputs the MRS source signals MREGI<0:12> and the MRS selection signals NMRSP, EMRSP, EMRSP2, EMRSP3, and TMRSP through the global input/output lines GIO to corresponding semiconductor memory blocks in the memory cell region of the semiconductor memory device 700. The semiconductor memory blocks include the MRS command generators 290A to 290E of FIG. 3. The MRS command generators 290A to 290E receive the MRS source signals MREGI<0:12> and the corresponding MRS selection signals NMRSP, EMRSP, EMRSP2, EMRSP3, and TMRSP through the local input/output lines LIO connected to the global input/output lines GIO.

According to exemplary embodiments of the present invention, the size of a peripheral circuit region may be reduced by disposing an MRS command generator for generating a plurality of MRS commands at a position where a corresponding MRS command is used inside of a semiconductor memory block.

According to exemplary embodiments of the present invention, many MRS codes are received through a data pad and diverse MRS commands may be generated.

According to exemplary embodiments of the present invention, the time taken for generating an MRS command may be reduced by receiving many MRS codes through a data pad and decoding them all at once.

According to exemplary embodiments of the present invention, MRS commands may be transferred without forming an additional data line because MRS commands are transferred to the constituent elements where the MRS commands are used inside of a semiconductor memory block through existing data lines, such as, global input/output lines GIO and local input/output lines LIO.

According to exemplary embodiments of the present invention, since a data buffer is driven when an MRS code for generating an MRS command is inputted, unnecessary current consumption may be prevented.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a controller configured to generate a data buffer control signal in a mode register set (MRS) mode;
   a data buffer configured to buffer and output a plurality of MRS codes inputted through a data pad in response to the data buffer control signal; and
   a plurality of MRS command generators configured to receive the MRS codes outputted from the data buffer through a data line and generate a plurality of MRS commands based on the received MRS codes.

2. The semiconductor memory device of claim 1, wherein the controller generates the data buffer control signal in response to a particular address transferred from outside, when a data line driving signal is applied in the MRS mode.

3. The semiconductor memory device of claim 2, wherein the controller comprises:
   an address comparison unit configured to generate a first signal for driving the data buffer when the received address is the same as a first address, and generating a second signal for stopping the data buffer from driving when the received address is the same as a second address; and
   a control signal generation unit configured to generate the data buffer control signal by logically combining the data line driving signal, the first signal, and the second signal.

4. The semiconductor memory device of claim 2, wherein the data line driving signal is a write enable (WE) signal or an early write latency (EWL) signal.

5. The semiconductor memory device of claim 2, wherein the MRS command generators are formed inside corresponding semiconductor memory blocks where the MRS commands are used.

6. The semiconductor memory device of claim 1, wherein the data line comprises a global input/output line and a local input/output line.

7. The semiconductor memory device of claim 1, further comprising:
   a delayer configured to delay an MRS mode signal by a line delay amount of the data line and output a delayed MRS mode signal.

8. The semiconductor memory device of claim 7, wherein each of the MRS command generators transfers a selected MRS command from among the MRS commands to the corresponding semiconductor memory blocks in response to the delayed MRS mode signal.

9. The semiconductor memory device of claim 7, further comprising:
   an MRS mode signal generator configured to receive one or more external command signals and to generate the MRS mode signal, wherein the MRS mode signal is enabled in the MRS mode.

10. The semiconductor memory device of claim 1, wherein the data buffer parallelizes the MRS codes received in series through the data pad and transfers the parallelized MRS codes to the global input/output line.

11. The semiconductor memory device of claim 2, further comprising:

an MRS source signal generator configured to receive first MRS codes from the data buffer, generate a plurality of MRS source signals, and output the generated MRS source signals to a global line in response to the MRS mode signal; and an MRS selection signal generator configured to receive second MRS codes from the data buffer, generate a plurality of MRS selection signals, and output the generated MRS selection signals to the global line in response to the MRS mode signal.

12. The semiconductor memory device of claim 11, wherein the MRS source signals are signals for setting a mode of the semiconductor memory device, and the MRS selection signals are signals for selecting a kind of MRS for setting up the mode of the semiconductor memory device among the multiple MRS commands.

13. The semiconductor memory device of claim 1, wherein the MRS commands are sequentially generated.

14. The semiconductor memory device of claim 1, wherein at least one additional data pad is provided to input the plurality of MRS codes.

15. The semiconductor memory device of claim 14, wherein the MRS commands are simultaneously generated.

16. A method for operating of a semiconductor memory device, comprising:
generating a data buffer control signal in a mode register set (MRS) mode;
buffering and outputting a plurality of MRS codes inputted through a data pad in response to the data buffer control signal; and
receiving the MRS codes through a data line and generating a plurality of MRS commands based on the received MRS codes.

17. The method of claim 16, wherein the data buffer control signal is generated in response to a particular address transferred from outside, when a data line driving signal is applied in the MRS mode.

18. The method of claim 16, wherein the generating of the data buffer control signal, comprises:
generating a first signal for driving the data buffer when the particular address is the same as a first address, and
generating a second signal for stopping the data buffer from driving when the particular address is the same as a second address; and
generating the data buffer control signal by logically combining the data line driving signal, the first signal, and the second signal.

19. The method of claim 16, wherein the plurality of MRS commands are generated inside corresponding semiconductor memory blocks where the MRS commands are used.

20. The method of claim 17, further comprising:
receiving first MRS codes from the data buffer, generating a plurality of MRS source signals, and outputting the generated MRS source signals to a global line in the MRS mode; and
receiving second MRS codes from the data buffer, generating a plurality of MRS selection signals, and outputting the generated MRS selection signals to the global line in the MRS mode.

21. The method of claim 20, further comprising:
generating an MRS mode signal in the MRS mode;
delaying the MRS mode signal by a line delay amount of the data line; and
outputting a delayed MRS mode signal.

22. The method of claim 21, wherein the generating of the plurality of MRS commands comprises:
receiving the MRS source signals;
receiving the MRS selection signals; and
generating the plurality of MRS commands based on the received MRS source signals and MRS selection signals in response to the delayed MRS mode signal.

23. The method of claim 16, further comprising:
parallelizing the MRS codes received in series through the data pad; and
transferring the parallelized MRS codes to the global input/output line.

24. The method of claim 16, further comprising:
inputting additional MRS codes through one or more additional data pads in response to the data buffer control signal.

* * * * *